US008174170B1

(12) United States Patent
Kuypers et al.

(10) Patent No.: US 8,174,170 B1
(45) Date of Patent: May 8, 2012

(54) METHODS AND APPARATUS FOR MECHANICAL RESONATING STRUCTURES

(75) Inventors: Jan H. Kuypers, Cambridge, MA (US); David M. Chen, Brookline, MA (US); Guiti Zolfagharkhani, Brighton, MA (US); Alexei Gaidarzhy, Brighton, MA (US)

(73) Assignee: Sand 9, Inc., Cambridge, MA (US)

( * ) Notice: Subject to any disclaimer, the term of this patent is extended or adjusted under 35 U.S.C. 154(b) by 0 days.

(21) Appl. No.: 12/764,703

(22) Filed: Apr. 21, 2010

Related U.S. Application Data

(60) Provisional application No. 61/177,706, filed on May 13, 2009.

(51) Int. Cl.
*H01L 41/09* (2006.01)

(52) U.S. Cl. ........................ 310/368; 310/345

(58) Field of Classification Search ................. 310/345, 310/348, 368
See application file for complete search history.

(56) References Cited

U.S. PATENT DOCUMENTS

| | | | | |
|---|---|---|---|---|
| 2,820,911 A | * | 1/1958 | Klingsporn | 310/348 |
| 3,143,672 A | * | 8/1964 | Mason | 310/361 |
| 4,216,402 A | * | 8/1980 | Engdahl | 310/320 |
| 4,511,821 A | * | 4/1985 | Nakamura et al. | 310/354 |
| 4,612,471 A | * | 9/1986 | Nakamura et al. | 310/321 |
| 5,541,469 A | * | 7/1996 | Kaida | 310/367 |
| 5,648,746 A | * | 7/1997 | Kaida | 333/189 |
| 5,914,553 A | | 6/1999 | Adams et al. | |
| 6,124,765 A | | 9/2000 | Chan et al. | |
| 6,538,535 B2 | * | 3/2003 | Guglielmi et al. | 333/208 |
| 6,828,713 B2 | | 12/2004 | Bradley et al. | |
| 6,909,221 B2 | | 6/2005 | Ayazi et al. | |
| 6,943,484 B2 | | 9/2005 | Clark et al. | |
| 6,954,020 B2 | | 10/2005 | Ma et al. | |
| 6,985,051 B2 | | 1/2006 | Nguyen et al. | |
| 6,995,622 B2 | | 2/2006 | Partridge et al. | |
| 7,005,946 B2 | | 2/2006 | Duwel et al. | |
| 7,211,926 B2 | | 5/2007 | Quevy et al. | |
| 7,215,061 B2 | | 5/2007 | Kihara et al. | |
| 7,352,608 B2 | | 4/2008 | Mohanty et al. | |
| 7,423,363 B2 | * | 9/2008 | Tanaka et al. | 310/320 |
| 7,492,241 B2 | | 2/2009 | Piazza et al. | |
| 7,498,723 B2 | * | 3/2009 | Tsuchido | 310/348 |

(Continued)

FOREIGN PATENT DOCUMENTS

JP  53-098793 A  *  8/1978

(Continued)

OTHER PUBLICATIONS

Humad et al., "High frequency micromechanical piezo-on-silicon block resonators," Int'l Electron Devices Meeting 2003 IEDM. Technical Digest, Washington, D.C. Dec. 8-10, 2003, New York, NY: IEEE US Dec. 8, 2003, pp. 957-960.

(Continued)

*Primary Examiner* — Thomas Dougherty
(74) *Attorney, Agent, or Firm* — Wolf, Greenfield & Sacks, P.C.

(57) ABSTRACT

Mechanical resonating structures and related methods are described. The mechanical resonating structures may provide improved efficiency over conventional resonating structures. Some of the structures have lengths and widths and are designed to vibrate in a direction approximately parallel to either the length or width. They may have boundaries bounding the length and width dimensions, which may substantially align with nodes or anti-nodes of vibration.

34 Claims, 9 Drawing Sheets

U.S. PATENT DOCUMENTS

| | | |
|---|---|---|
| 7,504,909 B2 | 3/2009 | Tada |
| 7,724,103 B2 | 5/2010 | Feng et al. |
| 7,791,432 B2 | 9/2010 | Piazza et al. |
| 2005/0073078 A1 | 4/2005 | Lutz et al. |
| 2008/0143217 A1 | 6/2008 | Ho et al. |
| 2008/0204153 A1 | 8/2008 | Yoshida et al. |
| 2008/0272852 A1 | 11/2008 | Six |
| 2009/0108381 A1 | 4/2009 | Buchwalter et al. |
| 2009/0108959 A1 | 4/2009 | Piazza et al. |
| 2009/0144963 A1 | 6/2009 | Piazza et al. |
| 2009/0294638 A1 | 12/2009 | Mohanty et al. |
| 2010/0007443 A1 | 1/2010 | Mohanty et al. |
| 2010/0134207 A1 | 6/2010 | Mohanty et al. |
| 2010/0155883 A1 | 6/2010 | Wenzler et al. |
| 2010/0182102 A1 | 7/2010 | Kuypers et al. |

FOREIGN PATENT DOCUMENTS

| | | | |
|---|---|---|---|
| JP | 54-037492 A | * | 3/1979 |
| WO | WO 02/17481 A2 | | 2/2002 |
| WO | WO 2006/000611 A1 | | 1/2006 |
| WO | WO 2010/011288 A1 | | 1/2010 |
| WO | WO 2010/077313 A1 | | 7/2010 |

OTHER PUBLICATIONS

International Search Report and International Preliminary Report on Patentability for PCT/US2006/021298 mailed Nov. 6, 2006 and Dec. 6, 2007 respectively.

Piazza et al., "Low motional resistance ring-shaped contour-mode aluminum nitride piezoelectric micromechanical resonators for UHF applications," Micro Electro Mechanical Systems, 2005. MEMS 2005. 18$^{th}$ IEEE International Conference on Miami Beach, Florida, Jan. 30-Feb. 3, 2005, Piscataway, New Jersey, US, IEEE Jan. 30, 2005, pp. 20-23.

Tirole et al., "Lamb Waves Pressure Sensor Using an AlN/Si Structure," Proceedings Ultrasonics Symposium, Oct. 10, 1993-Nov. 3, 1993, Baltimore, MD, IEEE 1993 vol. 1, pp. 371-374.

* cited by examiner

METHODS AND APPARATUS FOR MECHANICAL RESONATING STRUCTURES

RELATED APPLICATIONS

The present application claims the benefit under 35 U.S.C. §119(e) of U.S. Provisional Patent Application Ser. No. 61/177,706 filed May 13, 2009 entitled "Methods and Apparatus for Mechanical Resonating Structures", which is hereby incorporated herein by reference in its entirety.

BACKGROUND

1. Field

The technology described herein relates to mechanical resonating structures.

2. Related Art

Some resonators include a mechanical structure configured to vibrate in at least one dimension. Some typical mechanical resonators are capable of vibrating in multiple dimensions (e.g., two or three dimensions), and are capable of exhibiting various vibration modes. Some such mechanical resonators are plate-shaped, and are planar. In some of the vibration modes, the plate-shaped planar mechanical resonator vibrates primarily in one dimension (e.g., in an x-direction), but also exhibits lesser, secondary vibration in at least one other dimension (e.g., in a y-direction and/or a z-direction). The larger vibration in the one dimension (e.g., the x-direction) may be the desirable vibration, while the vibration in the other dimensions may be a consequence of the desired vibration.

SUMMARY

Mechanical resonating structures and related methods are described.

According to one aspect, a device comprises a substantially planar mechanical resonating structure having a length and a width. The mechanical resonating structure is operable to exhibit primary vibration having a direction approximately parallel to the length of the mechanical resonating structure and secondary vibration having a direction approximately parallel to the width of the mechanical resonating structure. Sides of the mechanical resonating structure substantially align with nodes of the secondary vibration for a resonance frequency of the mechanical resonating structure.

According to another aspect, a device comprises a substantially planar suspended mechanical resonating structure comprising a piezoelectric material. The mechanical resonating structure has a length and a width, and is coupled to a substrate by one or more anchors contacting sides of the mechanical resonating structure. The mechanical resonating structure is configured to support plate acoustic modes of vibration in which the mechanical resonating structure exhibits primary vibration having a direction approximately parallel to the length of the mechanical resonating structure and secondary vibration having a direction approximately parallel to the width of the mechanical resonating structure. The primary vibration has a magnitude at least two times larger than a magnitude of the secondary vibration. Ends of the mechanical resonating structure substantially align with anti-nodes of the primary vibration. Sides of the mechanical resonating structure substantially align with nodes of the secondary vibration. At least one of the one or more anchors contacts the mechanical resonating structure at a point lying substantially on a node of the primary vibration and a node of the secondary vibration.

According to another aspect, a device comprises a mechanical resonating structure having a periphery lying substantially within a first plane, the periphery formed of one or more segments, wherein each of the one or more segments substantially aligns with either a node or anti-node of vibration of a resonance mode of the mechanical resonating structure.

According to another aspect, a device comprises a mechanical resonating structure configured to exhibit plate acoustic modes of vibration in which the mechanical resonating structure vibrates in a primary direction and a secondary direction. The device further comprises an anchor interconnecting the mechanical resonating structure to a body, the anchor positioned to contact the mechanical resonating structure at a point positioned approximately on a node of vibration of the mechanical resonating structure in the secondary direction.

BRIEF DESCRIPTION OF THE DRAWINGS

Various aspects of the technology will be described with reference to the following figures. It should be appreciated that the figures are not necessarily drawn to scale. Also, the same reference number appearing in multiple figures refers to the same item.

DETAILED DESCRIPTION

Mechanical resonating structures and related methods are described. According to some aspects, a mechanical resonating structure exhibits primary vibration in the direction of (or approximately parallel to, which includes exactly parallel to) its length (e.g., an x-direction) and secondary vibration in the direction of its width. The width may be chosen to minimize the amount of displacement associated with the secondary vibration at the width boundaries. Accordingly, the efficiency of the mechanical resonating structure may be improved. According to some aspects, anchors connect the mechanical resonating structure to a body (e.g., a substrate, or any other suitable type of body, which in some situations may be fixed). The anchors may be positioned to optimize their impact on the primary vibration of the mechanical resonating structure (e.g., to minimize their impact in some embodiments, or to maximize their impact in other embodiments).

The aspects described above, as well as additional aspects, will now be described in greater detail. These aspects may be used individually, all together, or in any combination of two or more.

Figure 1:
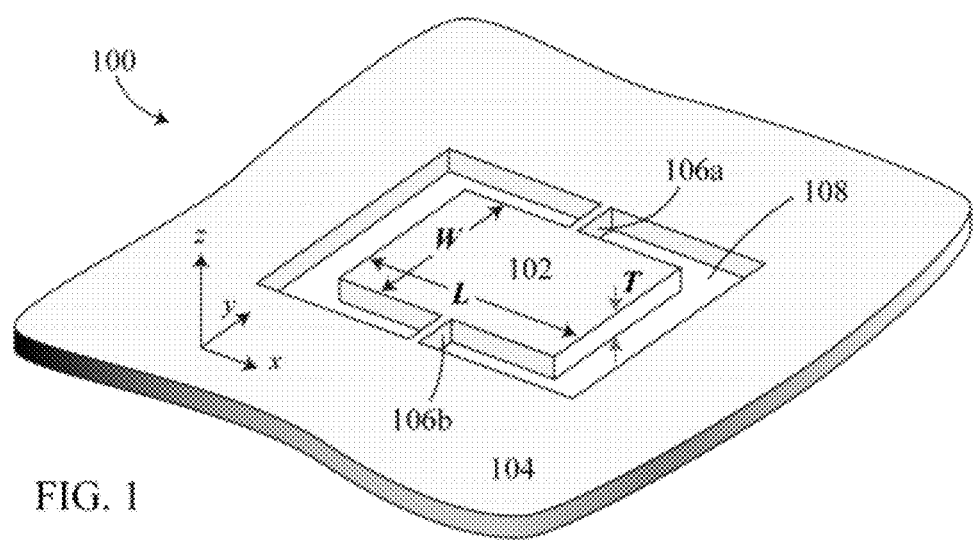
FIG. 1 illustrates a device comprising a mechanical resonating structure connected to a substrate by two anchors, according to one embodiment of the technology described herein.

FIG. 1 illustrates a device 100 comprising a mechanical resonating structure 102, having a length L, width W, and thickness T, coupled to a body 104 (e.g., a silicon substrate, or any other suitable body) by two anchors 106a and 106b. In some embodiments, the length L is at least one and half times as large as the width W, although not all embodiments are limited in this respect. The mechanical resonating structure 102 is substantially planar, but not all embodiments of the present technology are limited to using planar resonating structures. Although coupled by the anchors 106a and 106b, the mechanical resonating structure 102 is otherwise separated from the body 104 by an air gap 108, and therefore is a suspended mechanical resonating structure.

The mechanical resonating structure 102 may vibrate in multiple dimensions. For example, the mechanical resonating structure may be configured to vibrate primarily in a direction approximately parallel to its length, i.e., approximately in the x-direction in FIG. 1. In some operating scenarios, although it may be desired for the mechanical resonating structure to only vibrate along its length, such vibration may also result in vibration approximately parallel to the width (e.g., vibration approximately in the y-direction in the non-limiting example of FIG. 1) and/or thickness (e.g., vibration approximately in the z-direction in the non-limiting example of FIG. 1). For example, if the mechanical resonating structure is configured to support plate acoustic modes of vibration (i.e., any two-dimensional or three-dimensional modes of vibration; e.g., Lamb waves), vibration approximately parallel to the length may give rise to vibration approximately parallel to the width and/or thickness. According to some embodiments, vibration "approximately parallel" to a direction includes vibration exactly parallel to the direction.

In some embodiments, the vibration in the primary direction (e.g., the x-direction in this non-limiting example) is greater than the vibration in the y- and/or z-directions. For purposes of this application, such vibration is referred to as "primary vibration" whereas the smaller vibration is referred to as "secondary vibration." In some embodiments, the magnitude of the primary vibration is at least two times greater than the magnitude of the secondary vibration. In some embodiments, the magnitude of the primary vibration is at least four times greater than the magnitude of the secondary vibration (e.g., at least 10 times greater, between 10 and 100 times greater, etc.). In some embodiments, the magnitude of the primary vibration is approximately four times greater than the secondary vibration. According to some embodiments, the magnitude of the primary vibration is between approximately two and six times greater than the magnitude of the secondary vibration (e.g., three times greater, four times greater, any other suitable amount within this range). Thus, the various embodiments described herein involving primary and secondary vibration are not limited to the primary vibration being greater than the secondary vibration by any particular amount.

According to one aspect of the technology described herein, mechanical resonating structures configured to exhibit primary and secondary vibration within a plane are dimensioned to minimize any impact of the secondary vibration on the primary vibration. The secondary vibration may impact the efficiency of the mechanical resonating structure, and therefore aspects of the technology described herein minimize the impact of the secondary vibration on the efficiency of the mechanical resonating structure. A non-limiting example is now described with respect to the mechanical resonating structure 102 of FIG. 1, which is illustrated in FIG. 2.

Figure 2:
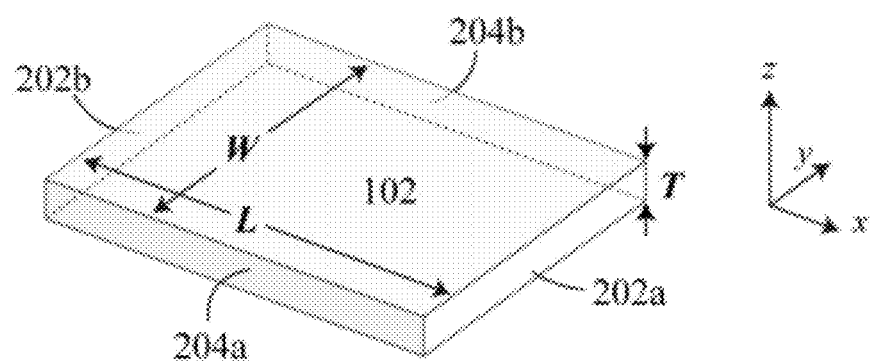
FIG. 2 illustrates the mechanical resonating structure shown in FIG. 1.

The mechanical resonating structure 102 shown in FIG. 2 may be dimensioned to reduce the impact of secondary vibration having a direction approximately parallel to the width on primary vibration having a direction approximately parallel to the length direction. As shown, the length L of the mechanical resonating structure 102 is bounded by the two ends, 202a and 202b. The width W is bounded by the two sides 204a and 204b. The mechanical resonating structure may be configured or excited to exhibit primary vibration having a direction approximately parallel to the length L, i.e., approximately in the x-direction in the non-limiting example of FIG. 2. However, such primary vibration may be accompanied by secondary vibration having a direction approximately parallel to the width W, i.e., approximately in the y-direction in FIG. 2. While such secondary vibration has not been conventionally considered in designing mechanical resonating structures of the general type shown in FIG. 2, Applicants have appreciated that this secondary vibration sometimes impacts the primary vibration of the mechanical resonating structure, for example by reducing the efficiency (e.g., the Q factor) of such structures. Applicants have further appreciated that the impact of the secondary vibration may be reduced or eliminated by substantially aligning the sides 204a and 204b with nodes of the secondary vibration. Thus, according to one non-limiting embodiment, the width W is chosen such that the sides 204a and 204b substantially align with nodes of any secondary vibration in the y-direction. According to some embodiments, one or both of the sides may be positioned within approximately $\Lambda/5$ of a node of the secondary vibration, where $\Lambda$ is the length of a period of displacement in the direction of secondary vibration, which may depend on the wavelength of primary vibration (e.g., FIG. 3B, described below, illustrates a single period of displacement in the direction of secondary vibration). According to some embodiments, one or both of the sides may be positioned within approximately $\Lambda/8$ of a node of the secondary vibration. According to some embodiments, one or both of the sides may be positioned within approximately $\Lambda/9$ of a node of the secondary vibration. According to some embodiments, one or both of the sides may be positioned within approximately $\Lambda/12$ of a node of the secondary vibration.

According to some embodiments, the length L of the mechanical resonating structure 102 is chosen to promote vibration in the direction of the length. For example, according to some embodiments, the length L of the mechanical resonating structure 102 is chosen so the ends 202a and 202b substantially align with anti-nodes of vibration in the direction of the length, i.e., in the x-direction in the non-limiting example of FIG. 2.

According to some embodiments, both the length and the width may have values which enhance the efficiency of the mechanical resonating structure when exhibiting primary vibration approximately parallel to the length. For example, the ends 202a and 202b may be positioned to substantially align with anti-nodes of vibration in the direction of the length while the sides 204a and 204b may be positioned to substantially align with nodes of vibration in the direction of the width. Thus, according to some non-limiting embodiments, the entire periphery (i.e., ends 202a and 202b, and sides 204a and 204b) of the mechanical resonating structure in the xy plane substantially aligns with nodes and anti-nodes of vibration of the structure. The periphery may be formed of one or more segments (e.g., ends 202a and 202b, and sides 204a and 204b), one or more of which may substantially align with anti-nodes of vibration while one or more may substantially align with nodes of vibration. Other configurations are also possible.

Figure 3A:
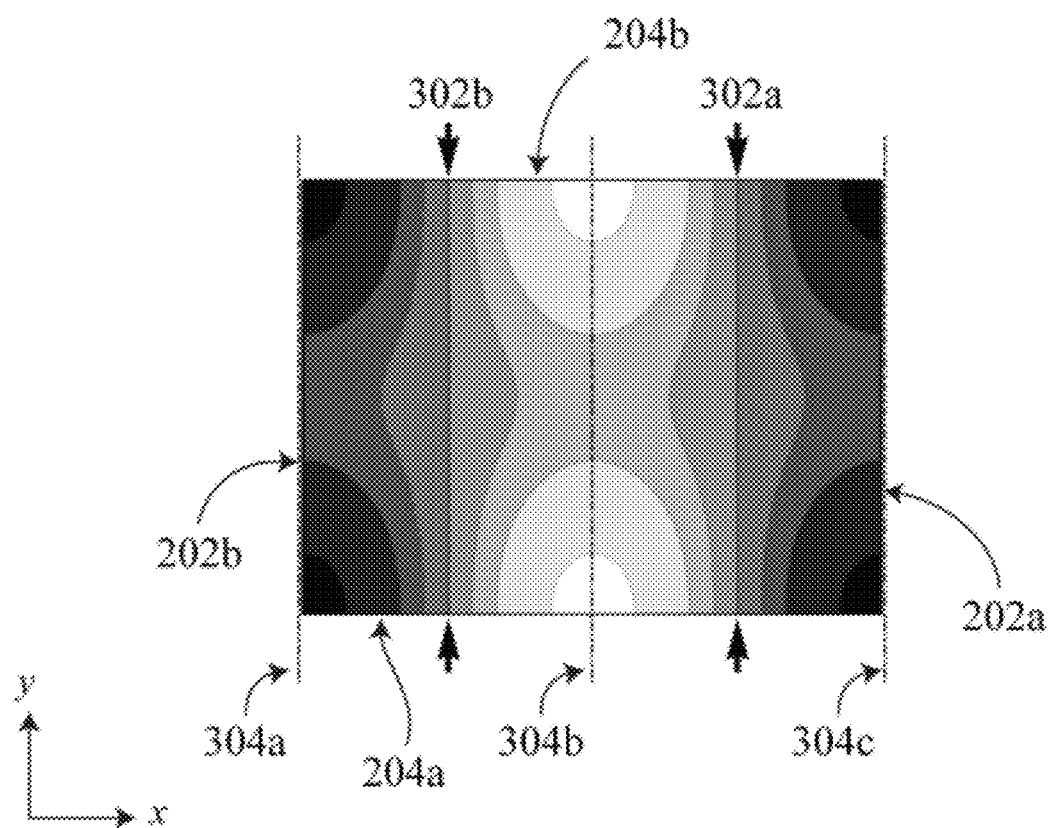
FIGS. 3A-3C illustrate an example of nodal behavior for a same frequency of vibration in two dimensions on the mechanical resonating structure of FIG. 1, according to one embodiment.
Figure 3B:
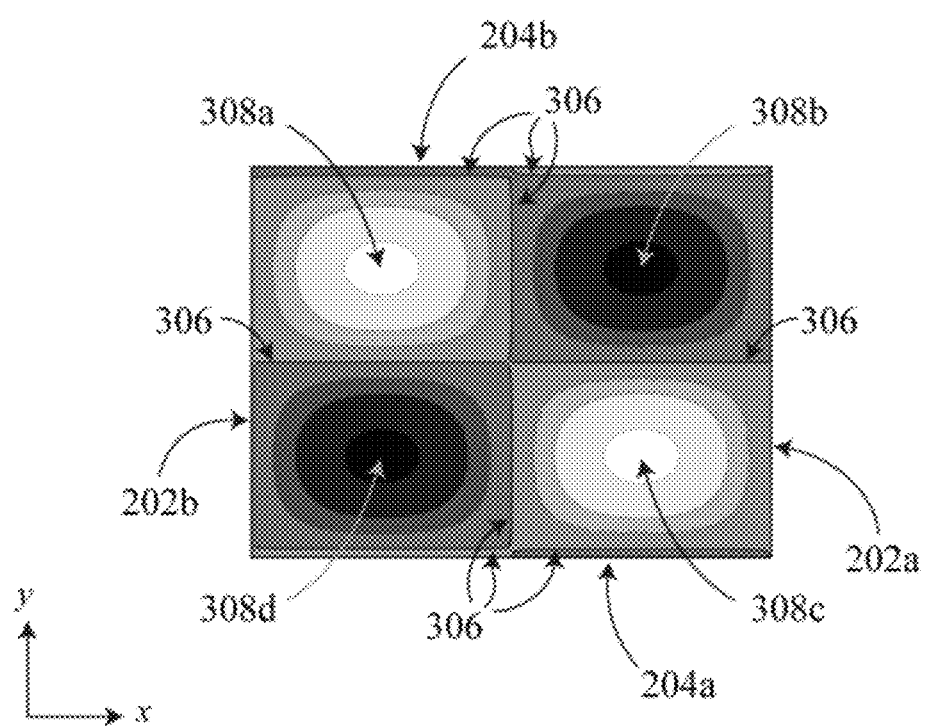
Figure 3C:
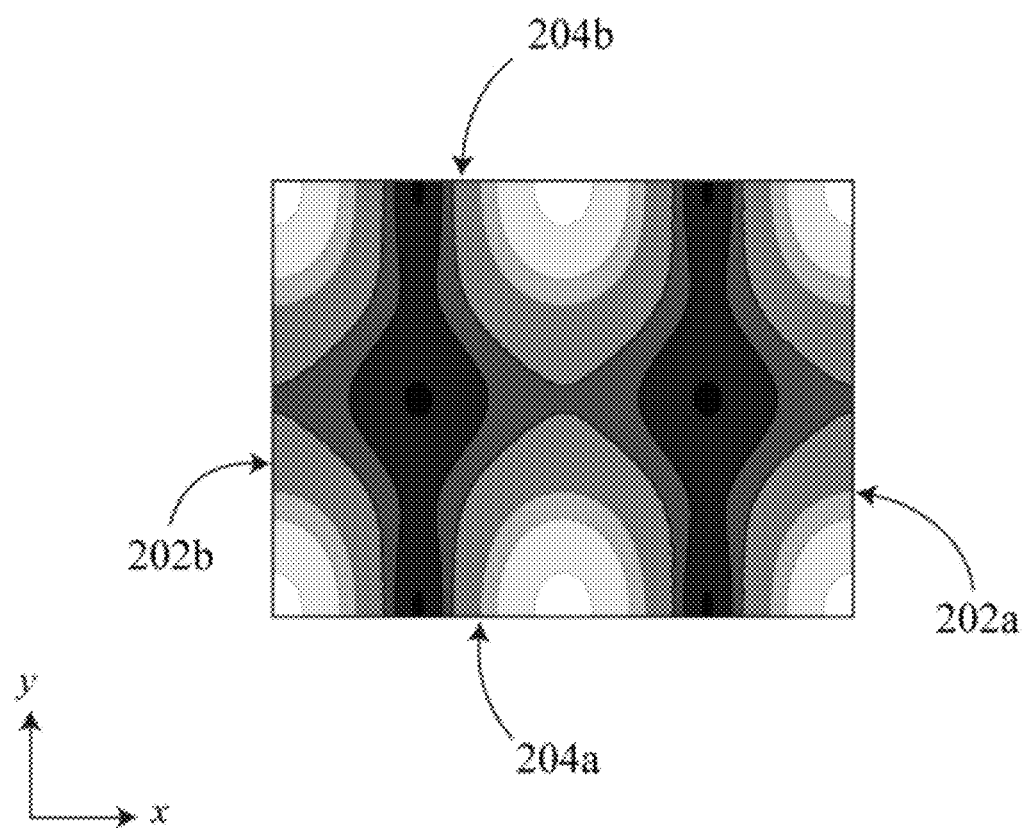

FIGS. 3A-3C provide a non-limiting example of the positioning of the periphery of a mechanical resonating structure relative to primary and secondary vibration nodes and anti-nodes, according to one embodiment. Specifically, FIGS. 3A-3C are plots of the normalized magnitude of displacement of the mechanical resonating structure 102 for one non-limiting mode of vibration, and thus show the nodal behavior of the mechanical resonating structure in this non-limiting example. FIGS. 3A-3C all relate to the same frequency of vibration. In FIGS. 3A-3B, the grayscale is from −1 (i.e., negative maximum displacement in this non-limiting embodiment, represented by black) to 1 (i.e., positive maximum displacement in this non-limiting embodiment, represented by white), with gray representing zero displacement. Thus, in FIGS. 3A-3B, black and white represent anti-nodes, while gray represents a node. In FIG. 3C, the grayscale is from 0 (i.e., minimum displacement in this non-limiting embodiment, represented by black) to 1 (i.e., maximum displacement in this embodiment, represented by white). Thus, in FIG. 3C, white represents anti-nodes and black represents a node.

FIG. 3A illustrates the normalized displacement magnitude within the mechanical resonating structure for a mode of primary vibration having one period of vibration in the x-direction, i.e., along the length of the structure in this non-limiting example. Thus, the nodal configuration for this mode of vibration may be seen in the figure. The nodes of the x-direction primary vibration are represented by lines 302a and 302b. Anti-nodes of the x-direction primary vibration are represented by lines 304a-304c.

FIG. 3B illustrates the normalized displacement magnitude within the mechanical resonating structure for secondary vibration corresponding to the primary vibration of FIG. 3A (i.e., for the same frequency of vibration as that of FIG. 3A). The nodal configuration for the secondary vibration can be seen in FIG. 3B. The nodes of the y-direction vibration are represented by lines 306. Thus, as shown, the sides 204a and 204b of the mechanical resonating structure substantially align with nodes of the y-direction vibration in the non-limiting example of FIG. 3B. The anti-nodes 308a-308d lie substantially at the center of four quadrants of the mechanical resonating structure.

FIG. 3C illustrates the total normalized displacement of the mechanical resonating structure for the mode of vibration of FIGS. 3A-3B, i.e., accounting for the displacement from the primary vibration of FIG. 3A and the secondary vibration of FIG. 3B. Thus, because the total displacement is not negative, the grayscale in FIG. 3C goes from 0 (i.e., minimum displacement (nodes), shown by black) to 1 (i.e., maximum displacement (anti-nodes), shown by white). As will be described, in some embodiments a mechanical resonating structure may be coupled to a body by one or more anchors. In some such embodiments, the anchors may be positioned at nodes of the total displacement, e.g., at the nodes illustrated in FIG. 3C.

It should be appreciated from the discussion of FIGS. 1-3C that various aspects of the technology may apply to various types of mechanical resonating structures. Therefore, the various aspects described herein are not limited to use with any particular type of mechanical resonating structures. Rather, the mechanical resonating structure may comprise or be formed of various materials, may be a single or multi-layered structure, may take various shapes, including straight-edged shapes and shapes with beveled edges (described further below), may have any suitable absolute dimensions, may have any operational frequency range and desired resonance frequency, and may be actuated and/or detected in any suitable manner.

For example, the various aspects described herein may apply to mechanical resonating structures comprising or formed of any suitable material(s) and having any composition. According to some embodiments, the mechanical resonating structure may comprise or be formed of a piezoelectric material. According to some embodiments, the mechanical resonating structure comprises silicon. According to some embodiments, the mechanical resonating structure comprises quartz, $LiNbO_3$, $LiTaO_3$, aluminum nitride (AlN), or any other suitable piezoelectric material (e.g., zinc oxide (ZnO), cadmium sulfide (CdS), lead titanate ($PbTiO_3$), lead zirconate titanate (PZT), potassium niobate ($KNbO_3$), $Li_2B_4O_7$, langasite ($La_3Ga_5SiO_{14}$), gallium arsenide (GaAs), barium sodium niobate, bismuth germanium oxide, indium arsenide, indium antimonide), either in substantially pure form or in combination with one or more other materials. Moreover, in some embodiments in which the mechanical resonating structure comprises a piezoelectric material, the piezoelectric material may be single crystal material. According to some embodiments, the mechanical resonating structure comprises one or more materials (e.g., in the form of layers or otherwise) that provide temperature compensation functionality, for example to compensate for temperature induced changes in the resonance behavior of the mechanical resonating structure. Examples of such structures are described in U.S. Pat. App. Ser. No. 61/138,171, filed Dec. 17, 2008 and titled "Mechanical Resonating Structures Including a Temperature Compensation Structure," and U.S. patent application Ser. No. 12/639,161, filed Dec. 16, 2009 entitled "Mechanical Resonating Structures Including a Temperature Compensation Structure", both of which are incorporated herein by reference in their entireties. According to some embodiments, the mechanical resonating structure may be partially or fully temperature compensated.

According to some embodiments, the mechanical resonating structure comprises or is formed of multiple layers, making the structure a composite structure. For example, the mechanical resonating structure may comprise a base on which electrodes are formed. In addition, the base may itself comprise one or more layers of differing materials, shapes, and/or thicknesses.

The mechanical resonating structures described herein may have any suitable dimensions. According to some embodiments, the mechanical resonating structure has a thickness T which, in some embodiments, is less than approximately three wavelengths of the resonance frequency of interest of the mechanical resonating structure. According to some embodiments, the thickness T is less than approximately 2 wavelengths of the resonance frequency of interest. According to some embodiments, the thickness is less than approximately one wavelength of the resonance frequency of interest (e.g., less than approximately one wavelength of a resonant Lamb wave supported by the mechanical resonating structure). Other thickness values are also possible. According to some embodiments, the thickness of the mechanical resonating structure is between approximately 2-100 times smaller than the length and width of the mechanical resonating structure (e.g., 5 times smaller, 10 times smaller, 50 times smaller, etc.), such that any vibration in the direction of the thickness may be negligible compared to vibration approximately parallel to the length and width. According to some embodiments, the mechanical resonating structures described herein have a large dimension (e.g., length, width, diameter, circumference, etc.) of less than approximately 1000 microns, less than 100 microns, less than 50 microns, or any other suitable value. It should be appreciated that other sizes are also possible. According to some embodiments, the devices described herein form part or all of a microelectromechanical system (MEMS).

According to some embodiments, a mechanical resonating structure has a width corresponding to the direction of secondary vibration of the structure, and the width has a value that may be chosen in dependence on the material(s) of which the structure is formed and the desired resonance frequency of the structure. For example, according to some embodiments, the mechanical resonating structure comprises MN (e.g., as an active layer), and the ratio of the width to the resonant wavelength of the structure ranges between approximately 0.6-0.9 (e.g., 0.7) or between approximately 1.2-1.8 (e.g., 1.5, 1.6, etc.). According to another embodiment, the mechanical resonating structure comprises silicon (e.g., as an active layer), and the ratio of the width to the resonant wavelength ranges between approximately 0.6-1.3 (e.g., 0.9, 1.1, etc.) or between approximately 1.6-2.2 (e.g., 1.8, 2.0, etc.). According to some embodiments, the ratio of the width of the structure to the resonant wavelength ranges between approximately 0.2-2.5, irrespective of the particular material(s) of which the structure is formed.

Figure 7:
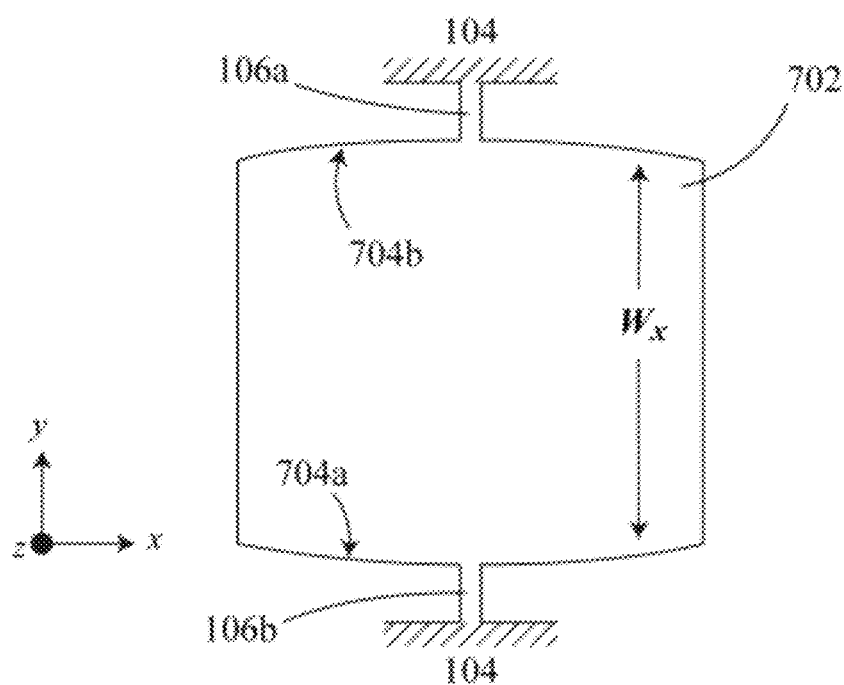
FIG. 7 illustrates a top-down view of a mechanical resonating structure having beveled edges, according to one embodiment.

According to some embodiments, the mechanical resonating structure may have a non-uniform length and/or width. For example, in those situations in which the mechanical resonating structure is substantially rectangular, the width of the structure may vary along the length (i.e., as a function of position in the direction of the length of the structure), an example of which is shown in FIG. 7, described below. Similarly, according to some embodiments, the length of the structure may vary along the width (i.e., as a function of position in the direction of the width of the structure). In some embodiments, both the length and width may vary. Such variations of the length and/or width may facilitate positioning of the ends and/or sides of the mechanical resonating structure to substantially align with anti-nodes or nodes of vibration, at points of minimum displacement, or may be used for any other reason. According to some embodiments, the length and/or width of a mechanical resonating structure varies as a function of position, and facilitates obtaining minimum displacements at the anchor locations.

The mechanical resonating structures may have any desired resonance frequency or frequencies, as the various aspects described herein are not limited to use with structures having any particular operating range or resonance frequency. For example, the resonance frequency of the mechanical resonating structures may be between 1 kHz and 10 GHz (e.g., between approximately 100 MHz and 150 MHz, between approximately 100 MHz and 3 GHz, or any other suitable values within this range). In some embodiments, the frequencies of operation of the mechanical resonating structure are in the upper MHz range (e.g., greater than 100 MHz), or at least 1 GHz (e.g., between 1 GHz and 10 GHz). In some embodiments, the output signal produced by the mechanical resonating structures may have a frequency of at least 1 MHz (e.g., 13 MHz, 26 MHz) or, in some cases, at least 32 kHz. In some embodiments, the operating frequency may range from 30 to 35 kHz, 60 to 70 kHz, 10 MHz to 1 GHz, 1 GHz to 3 GHz, 3 GHz to 10 GHz, or may have any other suitable range.

The mechanical resonating structure may be actuated and/or detected in any suitable manner, with the particular type of actuation and/or detection depending on the type of mechanical resonating structure, the desired operating characteristics, or any other suitable criteria. For example, suitable actuation and/or detection techniques include, but are not limited to, piezoelectric techniques, electrostatic techniques, magnetic techniques, thermal techniques, piezoresistive techniques, any combination of those techniques listed, or any other suitable techniques. The various aspects of the technology described herein are not limited to the manner of actuation and/or detection.

According to some embodiments, the mechanical resonating structures described herein may be piezoelectric Lamb wave devices, such as piezoelectric Lamb wave resonators. Such Lamb wave devices may operate based on propagating acoustic waves, with the edges of the structure (e.g., the ends and sides of mechanical resonating structure 102) serving as reflectors for the waves. For such devices, the spacing between the edges may define the resonance cavity, and resonance may be achieved when the cavity is an integer multiple of p, where $p=\lambda/2$, with $\lambda$ being the acoustic wavelength of the Lamb wave. However, it should be appreciated that aspects of the technology described herein apply to other types of structures as well, and that Lamb wave structures are merely non-limiting examples.

As mentioned with respect to FIG. 1, some embodiments include suspended mechanical resonating structures. The structures may be suspended in that they may have one or more segments which are not directly attached to any other structures. For example, in FIG. 1 the ends of the mechanical resonating structure are not directly attached to the body. It should be appreciated that various forms of "suspended" structures may be used, including, but not limited to, structures having any one or more free surfaces.

While FIG. 2 illustrates the dimensions of the mechanical resonating structure in the absence of surrounding structures, it should be appreciated from reference to FIG. 1 that such mechanical resonating structures may be coupled to additional components (e.g., anchors), and that the additional components may impact the choice of the dimensions of the structure. For example, the anchors 106a and 106b may impact the vibration of the mechanical resonating structure in the primary direction, the secondary direction, or in both directions, for example by constraining the motion of the sides of the mechanical resonating structure. According to an aspect of the technology, a mechanical resonating structure is dimensioned to minimize the impact of secondary vibration on primary vibration of the structure, taking into account the connections of the structure to other elements. For example, according to some embodiments, a mechanical resonating structure is coupled to a body (e.g., a substrate) by one or more anchors, and the anchors are positioned to minimize their impact on the vibration of the mechanical resonating structure (e.g., to minimize dissipation of the vibration). In some embodiments, the width of the mechanical resonating structure may be chosen to account for the impact of the anchors on the vibration. In some embodiments, the anchors may be positioned to maximize their impact on the vibration of the mechanical resonating structure (e.g., to maximize dissipation of the vibration).

According to some embodiments, a device comprising a mechanical resonating structure comprises one or more anchors coupling the mechanical resonating structure to a body, and at least one of the anchors contacts the mechanical resonating structure at a point of minimal displacement of the structure during operation. According to some embodiments, each of the one or more anchors contacts the mechanical resonating structure at a point of minimal displacement of the structure during operation. In some embodiments, the mechanical resonating structure is configured to exhibit primary vibration and secondary vibration, and the point at which an anchor contacts the mechanical resonating structure is approximately on a node of the primary vibration and/or secondary vibration. For example, referring to FIG. 3A, an anchor may be positioned to connect to the mechanical resonating structure at the point where the line 302a terminates on the side 204b, since that point lies substantially on a node of vibration in the x-direction and a node of vibration in the y-direction. Similarly, anchors may be positioned where 302a terminates on side 204a, where line 302b terminates on side 204a, and where line 302b terminates on side 204b. Such positioning of the anchor(s) may minimize or eliminate the impact of the anchors on the primary and/or secondary vibration. According to some embodiments, the anchors contact the mechanical resonating structure at points which lie approximately on nodes of both the primary and secondary vibration, and the sides of the mechanical resonating structure substantially align with nodes of the secondary vibration.

It should be appreciated that while two anchors are shown in FIG. 1, and four potential anchor locations have been described with respect to FIG. 3A, that any number of anchors may be used in those embodiments employing anchors, and that the technology described herein is not limited to use with any number of anchors. Thus, according to some embodiments, one or more anchors may be included and may be positioned in any of the manners described above, or in any other suitable locations.

Figure 4:
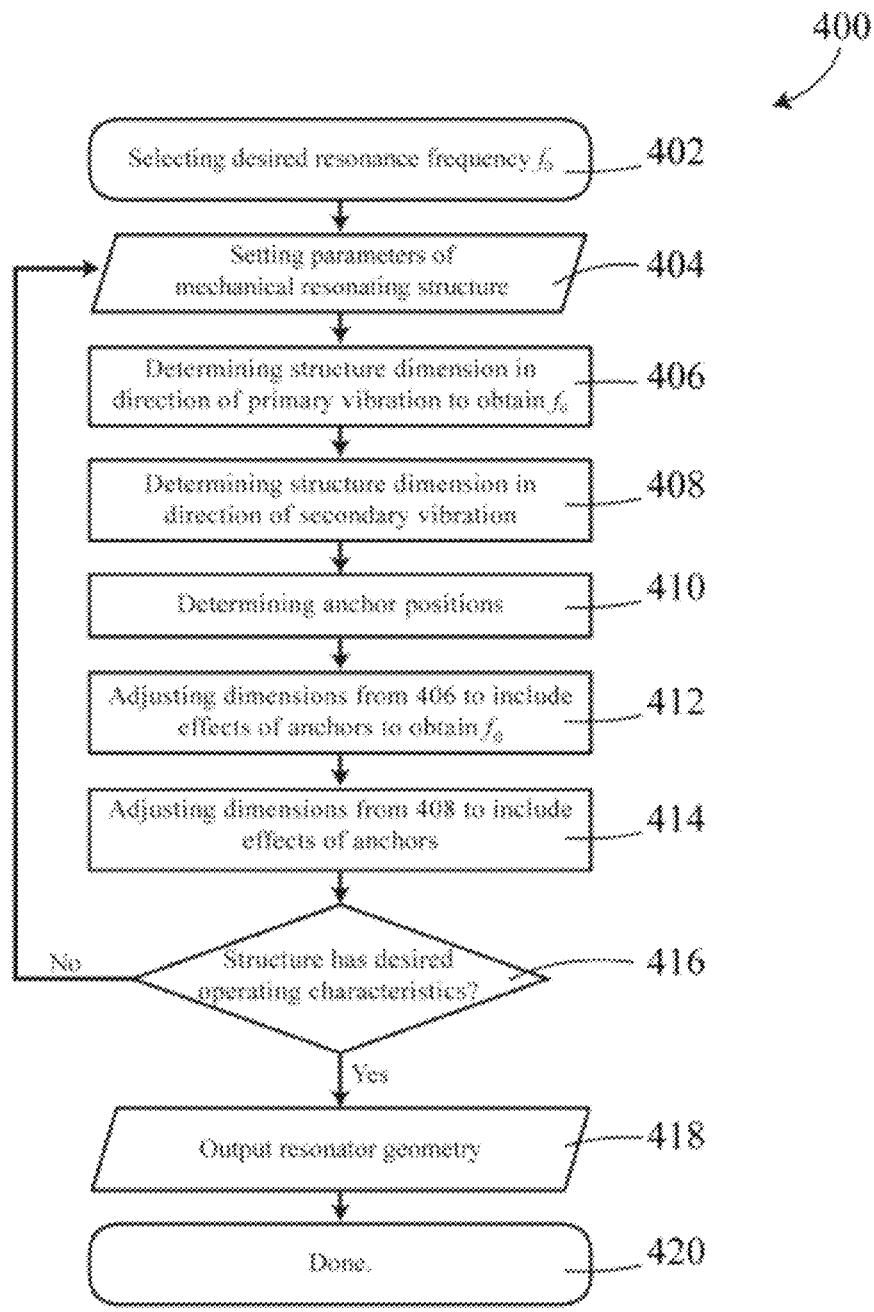
FIG. 4 is a flowchart of a method for determining the dimensions of a mechanical resonating structure, according to one non-limiting embodiment.

The dimensions of the mechanical resonating structure according to aspects of the technology described herein may be determined in any suitable manner. FIG. 4 illustrates one non-limiting example of a methodology by which the dimensions of the mechanical resonating structure may be determined. As illustrated, the method 400 is iterative. The iterative loop may be performed any number of times to produce a desired degree of accuracy, and therefore the methodology 400 is not limited to using any particular number of iterations. In addition, the method, or any of the sub-steps of the method, may be performed using any suitable hardware, software, manual calculations, or combination thereof. Furthermore, one or more of the steps of the method may be embodied by software, for example stored on a (non-transitory) computer readable storage medium, which may be executed by one or more processors to perform the steps. According to some embodiments, one or more of the sub-steps is performed using finite element analysis.

The method 400 begins at 402 with selecting the desired resonance frequency $f_o$. At 404, various parameters of the mechanical resonating structure may be set, or assigned. The parameters may include the general geometry of the mechanical resonating structure (e.g., rectangular, square, or other geometry), the material(s) and/or material properties (e.g., stiffness, density, etc.) of the structure, and the thicknesses of the mechanical resonating structure.

At 406, a value of the dimension of the mechanical resonating structure in the direction of the primary vibration to achieve the desired resonance frequency $f_0$ may be determined. According to some embodiments, the mechanical resonating structure is substantially rectangular, and is configured to exhibit primary vibration in a direction approximately parallel to its length. For such non-limiting embodiments, 406 may comprise determining the length of the mechanical resonating structure. The determination at 406 may be made in any suitable manner, as the methodology 400 is not limited in this respect.

At 408, a value of the dimension of the mechanical resonating structure in a direction of secondary vibration may be determined for the given resonance frequency $f_0$, to obtain minimum displacement of the mechanical resonating structure in this dimension as well as to reduce or prevent the occurrence of unwanted modes of vibration in proximity to $f_0$. According to some embodiments, the mechanical resonating structure is substantially rectangular and is configured to exhibit primary vibration having a direction approximately parallel to its length and secondary vibration having a direction approximately parallel to its width. For such non-limiting embodiments, 408 may comprise determining the width of the mechanical resonating structure for the given resonance frequency to achieve minimal or no displacement at the sides of the mechanical resonating structure and/or to reduce or prevent the occurrence of unwanted modes of vibration in close proximity to $f_0$.

At 410, the position(s) of any anchor(s) connected to the mechanical resonating structure may be determined, such that the impact of the anchor(s) on the primary and/or secondary vibration is minimal. For example, the position of the anchors may be chosen so that one or more of the anchors contacts the mechanical resonating structure at a point which is substantially on a node of vibration for the primary and/or secondary vibration. According to some embodiments, each of the anchors is positioned at such a point.

At 412, the value of the dimension in the direction of the primary vibration determined at 406 may be adjusted to account for any impact the anchors may have on the operation of the mechanical resonating structure (e.g., shifting the resonance frequency of the mechanical resonating structure or otherwise). Thus, in those embodiments in which the dimension from 406 is a length of the mechanical resonating structure, 412 may comprise adjusting the determined length to account for the anchors.

Similarly, at 414, the value of the dimension in the direction of the secondary vibration determined at 408 may be adjusted to account for any changes resulting from the placement of the anchors. In those embodiments in which 408 comprises determining a width of the mechanical resonating structure, 414 may comprise adjusting the width to account for the impact of the anchors on the mechanical resonating structure (e.g., on the resonance behavior of the mechanical resonating structure or otherwise).

At 416, a determination is made whether the mechanical resonating structure has the desired operating characteristics. While any operating characteristics may be assessed at 416, examples include the resonance frequency of the mechanical resonating structure, the presence of unwanted modes of vibration in proximity to the desired resonance frequency, desired efficiency targets (e.g., Q values), or any other suitable criteria. According to some embodiments, 416 comprises determining whether any unwanted modes of vibration are too close to the desired resonance frequency. Whether an unwanted mode is too close to the desired resonance frequency may depend on the specific application in which the mechanical resonating structure is to be used and/or the specific desired resonance frequency of the mechanical resonating structure.

According to some embodiments, the desired operating characteristics of the mechanical resonating structure may be met when the sides of the mechanical resonating structure align substantially with nodes of vibration in the secondary direction and when the ends of the mechanical resonating structure align substantially with anti-nodes of the primary vibration. However, not all embodiments are limited in this respect. The determination at 416 may be made in any suitable manner, including experimentally, using computational methods (software, manual, etc.), or in any other suitable manner.

If, at 416, it is determined that the mechanical resonating structure is appropriately dimensioned such that the mechanical resonating structure has the desired operating characteristics, the determined dimensions may be output at 418 and the method may finish at 420. If, on the other hand, at 416, the mechanical resonating structure is determined to not have the desired operating characteristics, the method may return to 404, and be repeated. In this manner, the method 400 is iterative.

Again, it should be appreciated that any suitable method may be used to determine the dimensions of the mechanical resonating structure, and method 400 is merely one non-limiting example. In addition, each of the sub-processes of method 400 (e.g., 404, 406, 408 . . . ) may be performed in any suitable manner, as the various aspects described herein are not limited in this respect.

While FIGS. 1-2 and FIG. 4 provide non-limiting examples of structures and methods according to some non-limiting embodiments of the technology described herein, it should be appreciated that such structures and methods may be varied in several respects, without departing from the scope of Applicants' contribution to the art. For example, depending on the type of mechanical resonating structure at issue, it may include one or more electrodes. For example, piezoelectric mechanical resonating structures may include one or more electrodes for actuation and/or detection of the operation of the structure. The mechanical resonating structures and methods described herein may account for such additional structures, to provide a suitably dimensioned and shaped mechanical resonating structure.

Figure 5:
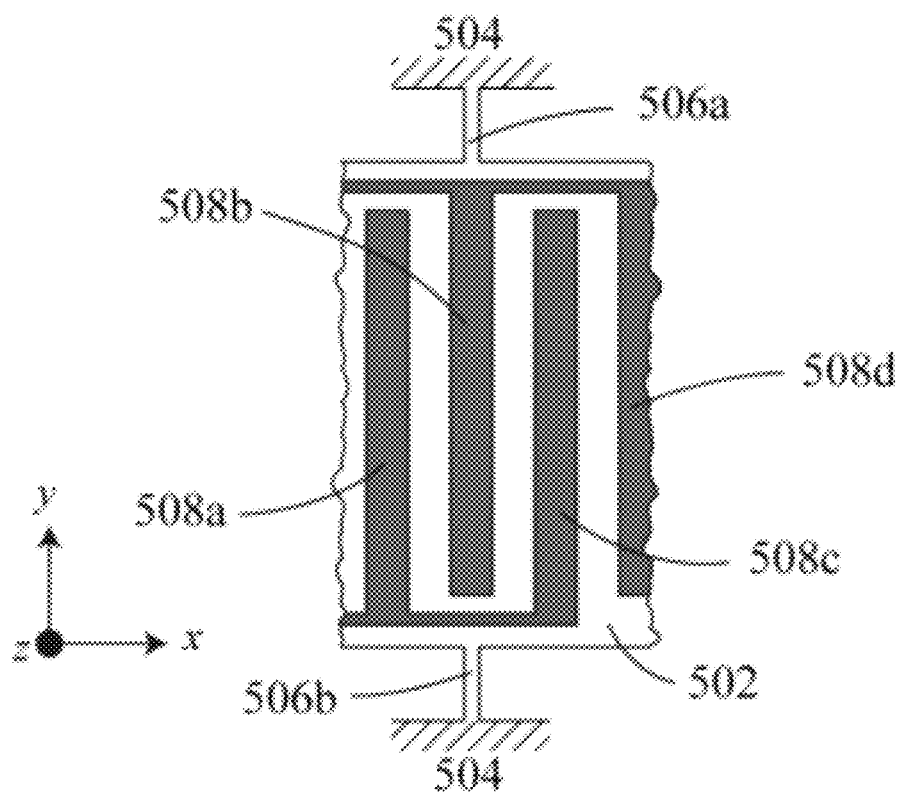
FIG. 5 illustrates a portion of a mechanical resonating structure comprising an electrode, according to one embodiment.

FIG. 5 provides an illustration, showing a portion of a mechanical resonating structure 502 connected to a body 504 by two anchors, 506a and 506b, and including four electrodes 508a-508d. According to some embodiments, the electrodes are positioned to minimize their movement during operation of the mechanical resonating structure. By so positioning the electrodes, their impact (if any) on the efficiency of the resonating structure may be minimized and the electric potential generated by the electrodes may have equipotential lines oriented in a desired manner. For example, one or more of the electrodes may be positioned to substantially align with the placement of the anchors 506a and/or 506b. In some embodiments, the anchors and one or more of the electrodes may be positioned to substantially align with nodes of vibration in the x-direction (e.g., nodes of primary vibration). For example, the centerline of electrode 508b (the centerline being the axis of symmetry oriented in the y-direction in FIG. 5) may substantially align with a node of vibration of the mechanical resonating structure in the x-direction. According to some embodiments, the anchor 506a and/or 506b is also aligned with the centerline of one or more of the electrodes.

Figure 6:
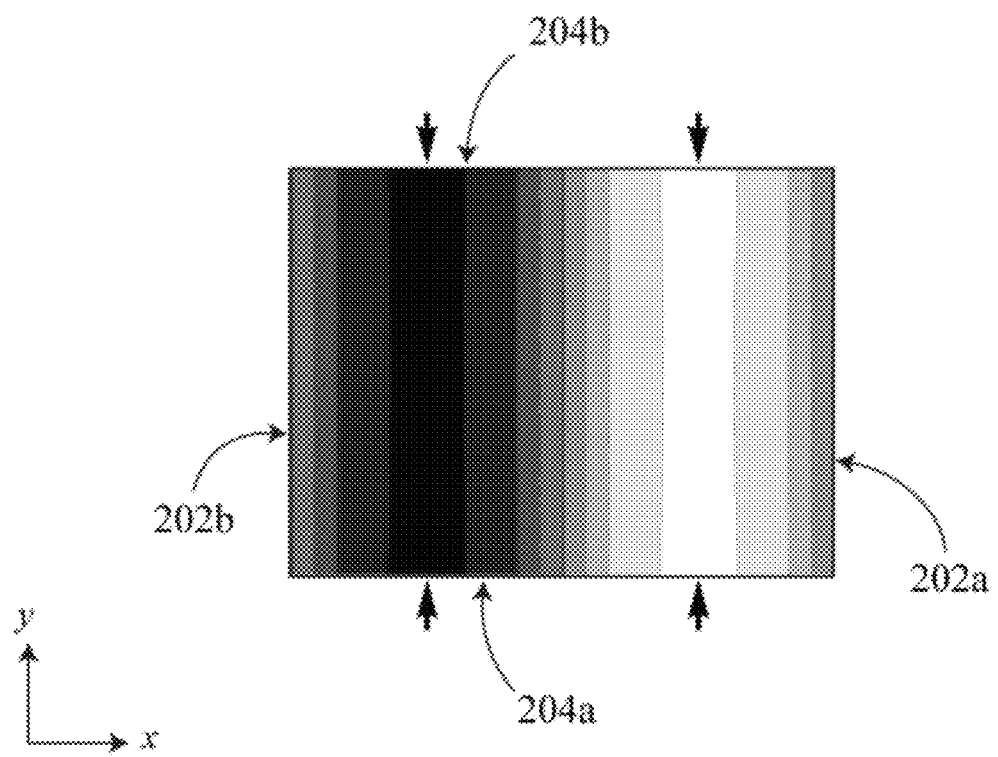
FIG. 6 illustrates the electric potential associated with a mechanical resonating structure comprising an electrode, according to one embodiment.

By positioning the electrodes such that they experience minimal movement during operation of the resonating structure (e.g., by positioning them such that their centerlines substantially align with nodes of vibration), the lines of electric potential generated by the electrodes may be substantially parallel to each other. FIG. 6 illustrates an example of the electric potential corresponding to the resonating structure dimensions for FIGS. 3A-3C, with electrodes positioned to create absolute maxima of the electric potential at the locations of the vertical black and white stripes. The four arrows indicate the positions at which anchors may contact the mechanical resonating structure (in those embodiments that use anchors), and coincide with the absolute maxima in the non-limiting example of FIG. 6. As can be seen, the electric potential lines are substantially parallel.

As mentioned above, in some embodiments mechanical resonating structures may not have uniform shapes, for example having beveled edges. Such shapes may optimize operation of the resonating structures, for example by facilitating placement of the ends and/or sides of the resonating structure to substantially align with anti-nodes or nodes of vibration. FIG. 7 provides a non-limiting example. As shown, the device 700 comprises a mechanical resonating structure 702 connected to the body 104 by anchors 106a and 106b. The mechanical resonating structure 702 has a width $W_x$ that varies with position along the x-direction (the length in the non-limiting example of FIG. 7) of the structure. In particular, the sides 704a and 704b are beveled.

It should be appreciated that the examples described thus far are not limiting. For example, while multiple examples have described devices having a length and a width and configured to exhibit primary vibration in a direction approximately parallel to the length and secondary vibration in a direction approximately parallel to the width, it should be appreciated that in some embodiments devices may be configured to exhibit primary vibration in a direction approximately parallel to a width of the device and secondary vibration in a direction approximately parallel to a length of the device. In some such embodiments, the ends of the device (bounding the length) may substantially align with nodes of the secondary vibration, and the sides of the device (bounding the width) may substantially align with anti-nodes of the primary vibration. Other orientations for primary and secondary vibration are also possible, as the aspects described herein including primary and secondary vibration are not limited to applications having any particular orientations of primary and/or secondary vibration.

The structures and devices described herein may be used as stand alone components, or may be incorporated into various types of larger devices. Thus, the various structures and methods described herein are not limited to being used in any particular environment or device. However, examples of devices which may incorporate one or more of the structures and/or methods described herein include, but are not limited to, tunable meters, mass sensors, gyroscopes, accelerometers, switches, and electromagnetic fuel sensors. According to some embodiments, the mechanical resonating structures described are integrated in a timing oscillator. Timing oscillators are used in devices including digital clocks, radios, computers, oscilloscopes, signal generators, and cell phones, for example to provide precise clock signals to facilitate synchronization of other processes, such as receiving, processing, and/or transmitting signals. In some embodiments, one or more of the multi-port devices described herein may form part or all of a MEMS.

Furthermore, one or more aspects of the invention (e.g., the method of FIG. 4) may be embodied as a non-transitory computer readable storage medium (or multiple non-transitory computer readable storage media) (e.g., a computer memory, one or more floppy discs, compact discs, optical discs, magnetic tapes, flash memories, circuit configurations in Field Programmable Gate Arrays or other semiconductor devices, or other non-transitory, tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

While some references have been incorporated herein by reference, it should be appreciated that the present application controls to the extent the incorporated references are inconsistent with what is described herein and/or the use of terminology herein.

Having thus described several aspects of at least one embodiment of the technology, it is to be appreciated that various alterations, modifications, and improvements will readily occur to those skilled in the art. Such alterations, modifications, and improvements are intended to be within the spirit and scope of the invention. Accordingly, the foregoing description and drawings provide non-limiting examples only.

What is claimed is:

1. A device comprising:
a substantially planar mechanical resonating structure having a length and a width, the mechanical resonating structure operable to exhibit primary vibration having a direction approximately parallel to the length of the mechanical resonating structure and secondary vibration having a direction approximately parallel to the width of the mechanical resonating structure,
wherein sides of the mechanical resonating structure substantially align with nodes of the secondary vibration for a resonance frequency of the mechanical resonating structure.

2. The device of claim 1, wherein ends of the mechanical resonating structure substantially align with anti-nodes of the primary vibration for the resonance frequency.

3. The device of claim 1, wherein the mechanical resonating structure has a substantially rectangular shape.

4. The device of claim 3, wherein the mechanical resonating structure has one or more beveled edges.

5. The device of claim 1, wherein a ratio of the width to a resonant wavelength of the mechanical resonating structure is between approximately 0.6-0.9.

6. The device of claim 1, wherein a ratio of the width to a resonant wavelength of the mechanical resonating structure is between approximately 1.2-1.8.

7. The device of claim 1, wherein the mechanical resonating structure has an operating frequency ranging from 30 to 35 kHz.

8. The device of claim 1, wherein the mechanical resonating structure has an operating frequency ranging from 60 to 70 kHz.

9. The device of claim 1, wherein the mechanical resonating structure has an operating frequency ranging from 100 MHz to 150 MHz.

10. The device of claim 1, wherein the mechanical resonating structure has an operating frequency ranging from 100 MHz to 3 GHz.

11. The device of claim 1, wherein the mechanical resonating structure has an operating frequency ranging from 3 GHz to 10 GHz.

12. The device of claim 1, wherein the mechanical resonating structure comprises a piezoelectric material.

13. The device of claim 12, wherein the piezoelectric material is chosen from the group consisting of: aluminum nitride (AlN), zinc oxide (ZnO), cadmium sulfide (CdS), lead titanate ($PbTiO_3$), lead zirconate titanate (PZT), lithium niobate ($LiNbO_3$), lithium tantalate ($LiTaO_3$), potassium niobate ($KNbO_3$), $Li_2B_4O_7$, langasite ($La_3Ga_5SiO_{14}$), gallium arsenide (GaAs), barium sodium niobate, bismuth germanium oxide, indium arsenide, and indium antimonide.

14. The device of claim 1, wherein the mechanical resonating structure is a suspended mechanical resonating structure, and wherein the mechanical resonating structure is coupled to a body by one or more anchors.

15. The device of claim 14, wherein at least one of the one or more anchors contacts the mechanical resonating structure at a point that lies substantially on a node of the primary vibration.

16. The device of claim 14, wherein at least one of the one or more anchors contacts the mechanical resonating structure at a point that lies substantially on a node of the secondary vibration.

17. The device of claim 16, wherein the at least one of the one or more anchors contacts the mechanical resonating structure at a point that lies substantially on a node of the primary vibration.

18. The device of claim 1, wherein the length is at least one and a half times as large as the width.

19. The device of claim 1, wherein the sides of the mechanical resonating structure include two sides, and wherein the two sides are each positioned within approximately $\Lambda/5$ of a node of the secondary vibration, where $\Lambda$ is a length of a period of displacement in the direction of the secondary vibration.

20. The device of claim 19, wherein each of the two sides is positioned within approximately $\Lambda/8$ of a node of the secondary vibration.

21. The device of claim 20, wherein each of the two sides is positioned within approximately $\Lambda/9$ of a node of the secondary vibration.

22. The device of claim 21, wherein each of the two sides is positioned within approximately $\Lambda/12$ of a node of the secondary vibration.

23. The device of claim 1,
wherein the substantially planar mechanical resonating structure is a suspended mechanical resonating structure, comprises a piezoelectric material, and is coupled to a substrate by one or more anchors contacting one or more of the sides of the mechanical resonating structure,
wherein the mechanical resonating structure is configured to support plate acoustic modes of vibration in which the primary vibration has a magnitude at least two times larger than a magnitude of the secondary vibration, and
wherein at least one of the one or more anchors contacts the mechanical resonating structure at a point lying substantially on a node of the primary vibration and a node of the secondary vibration.

24. The device of claim 1, wherein the mechanical resonating structure has a periphery lying substantially within a first plane, the periphery formed of one or more segments comprising the sides, wherein each of the one or more segments substantially aligns with either a node or anti-node of vibration of a resonance mode of the mechanical resonating structure.

25. The device of claim 24, wherein the mechanical resonating structure comprises a piezoelectric material.

26. The device of claim 24, wherein the mechanical resonating structure is configured to support plate acoustic modes of vibration.

27. The device of claim 24, wherein the mechanical resonating structure has a resonance frequency between approximately 100 MHz and 150 MHz.

28. The device of claim 1, further comprising
an anchor interconnecting the mechanical resonating structure to a body, the anchor positioned to contact a periphery of the mechanical resonating structure at a point positioned approximately on a node of the secondary vibration.

29. The device of claim 28, wherein the anchor interconnecting the mechanical resonating structure to the body is positioned to contact the mechanical resonating structure at a point positioned approximately on a node of the primary vibration.

30. The device of claim 28, wherein a largest dimension of the mechanical resonating structure is less than approximately 1000 microns.

31. The device of claim 30, wherein the mechanical resonating structure is substantially rectangular.

32. The device of claim 30, wherein the body is a substrate.

33. The device of claim 32, wherein the substrate has a cavity formed therein, and wherein the mechanical resonating structure is suspended above the cavity.

34. The device of claim 28, wherein the device comprises a plurality of anchors comprising the anchor, and wherein each of the plurality of anchors contacts the mechanical resonating structure at a respective contact point positioned approximately on a node of vibration of the mechanical resonating structure in the primary direction and on a node of vibration of the mechanical resonating structure in the secondary direction.

* * * * *

UNITED STATES PATENT AND TRADEMARK OFFICE
CERTIFICATE OF CORRECTION

PATENT NO. : 8,174,170 B1 Page 1 of 1
APPLICATION NO. : 12/764703
DATED : May 8, 2012
INVENTOR(S) : Jan H. Kuypers et al.

It is certified that error appears in the above-identified patent and that said Letters Patent is hereby corrected as shown below:

Column 7, line 12, the word "MN" should be "AIN".

Signed and Sealed this
Twenty-sixth Day of June, 2012

David J. Kappos
*Director of the United States Patent and Trademark Office*